(12) United States Patent
Horning et al.

(10) Patent No.: US 6,770,504 B2
(45) Date of Patent: Aug. 3, 2004

(54) METHODS AND STRUCTURE FOR IMPROVING WAFER BOW CONTROL

(75) Inventors: Robert D. Horning, Savage, MN (US); McDonald Robinson, Goleta, CA (US); Timothy Louis Scullard, Mesa, AZ (US)

(73) Assignee: Honeywell International Inc., Morristown, NJ (US)

( * ) Notice: Subject to any disclaimer, the term of this patent is extended or adjusted under 35 U.S.C. 154(b) by 67 days.

(21) Appl. No.: 10/337,011

(22) Filed: Jan. 6, 2003

(65) Prior Publication Data

US 2004/0132227 A1 Jul. 8, 2004

(51) Int. Cl.⁷ .......................... H01L 21/00; H01L 21/31; H01L 21/469
(52) U.S. Cl. ..................... 438/48; 438/50; 438/51; 438/783
(58) Field of Search ................... 438/48, 50, 51, 438/783, 933

(56) References Cited

U.S. PATENT DOCUMENTS

| | | | |
|---|---|---|---|
| 5,338,416 A | 8/1994 | Mlcak et al. | |
| 5,437,739 A | 8/1995 | Hays | |
| 5,492,596 A | 2/1996 | Cho | |
| 5,509,974 A | 4/1996 | Hays | |
| 5,511,428 A | 4/1996 | Goldberg et al. | |
| 5,637,189 A | 6/1997 | Peeters et al. | |
| 5,725,729 A | * 3/1998 | Greiff | 438/50 |
| 5,837,562 A | 11/1998 | Cho | |
| 5,843,832 A | 12/1998 | Farmer et al. | |
| 5,854,122 A | 12/1998 | Hays et al. | |
| 5,866,469 A | 2/1999 | Hays | |
| 6,128,961 A | 10/2000 | Haronian | |
| 6,143,583 A | * 11/2000 | Hays | 438/39 |
| 6,210,988 B1 | 4/2001 | Howe et al. | |
| 6,245,161 B1 | 6/2001 | Henley et al. | |
| 6,271,101 B1 | 8/2001 | Fukunaga | |
| 6,277,666 B1 | 8/2001 | Hays et al. | |
| 6,287,941 B1 | 9/2001 | Kang et al. | |
| 6,337,027 B1 | 1/2002 | Humphrey | |
| 6,428,713 B1 | 8/2002 | Christenson et al. | |
| 6,430,766 B1 | 8/2002 | Henley et al. | |
| 6,433,401 B1 | 8/2002 | Clark et al. | |
| 6,444,138 B1 | 9/2002 | Moon et al. | |
| 6,448,622 B1 | 9/2002 | Franke et al. | |
| 6,452,238 B1 | 9/2002 | Orcutt et al. | |
| 6,544,655 B1 | * 4/2003 | Cabuz et al. | 428/446 |
| 2003/0092213 A1 | * 5/2003 | Yamazaki et al. | 438/48 |
| 2003/0129845 A1 | * 7/2003 | Cabuz et al. | 438/695 |

* cited by examiner

Primary Examiner—Alexander Ghyka
(74) Attorney, Agent, or Firm—Matthew Luxton, Esq.; Armstrong Teasdale LLP

(57) ABSTRACT

A method for controlling bow in wafers which utilize doped layers is described. The method includes depositing a silicon-germanium layer onto a substrate, depositing an undoped buffer layer onto the silicon-germanium layer, and depositing a silicon-baron layer onto the undoped layer.

10 Claims, 5 Drawing Sheets

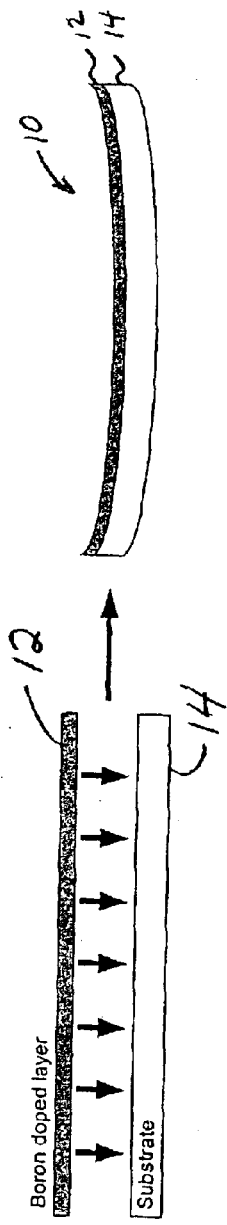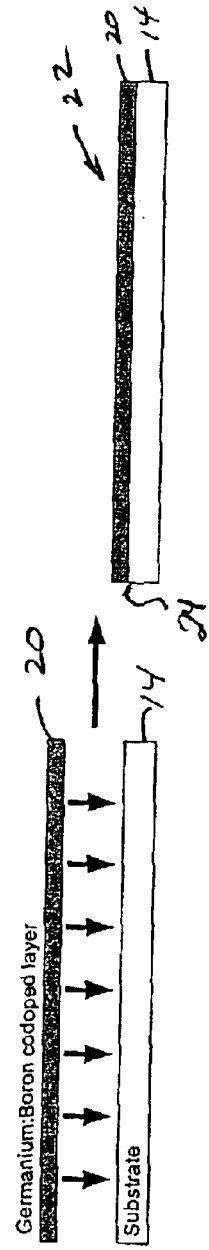

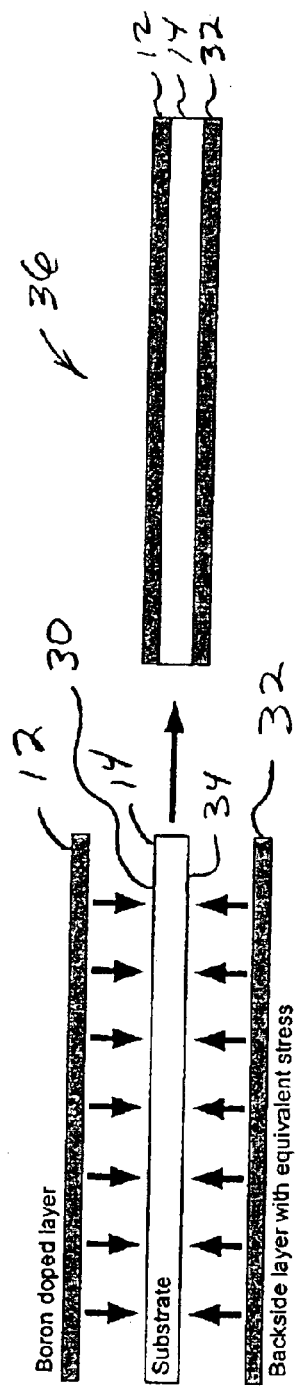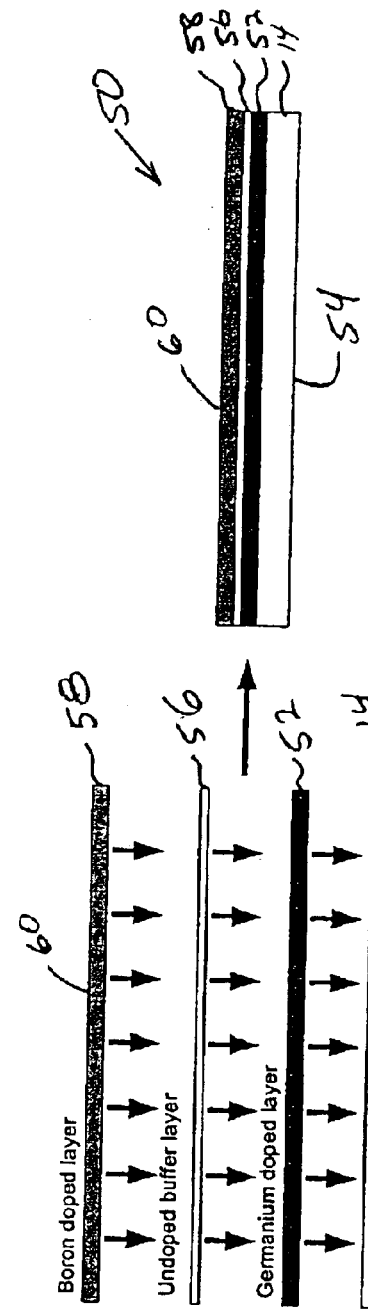

METHODS AND STRUCTURE FOR IMPROVING WAFER BOW CONTROL

STATEMENT REGARDING FEDERALLY SPONSORED RESEARCH & DEVELOPMENT

The United States Government has acquired certain rights in this invention pursuant to Contract No. F33615-01-02-5705 issued by the Department of the Air Force.

BACKGROUND OF THE INVENTION

This invention relates generally to manufacturing of Micro Electromechanical System (MEMS) devices, and more specifically to, manufacturing of a substrate layer for MEMS devices utilizing heavily doped silicon as an etch stop.

One method for making MEMS devices involves depositing a very heavily boron-doped silicon layer on a lightly doped silicon substrate wafer. After various patterning steps, part of the substrate is etched away in alkaline etchants such as potassium hydroxide or Ethylene-Diamine-Pyrocatechol (EDP), and water, plus a trace amount of Pyrazine. The heavily doped silicon layer is not affected by these etchants, creating a natural etch stop. In another method, the silicon wafer is bonded to a glass wafer. Prior to bonding, the silicon wafer can be patterned. Additional patterns can be made on the glass wafer. The entire lightly doped substrate is then etched away, leaving only the patterned, heavily doped layer attached to the glass. The boron dopant concentration in the doped layer is $>1\times10^{20}$ cm$^{-3}$. At this concentration the boron atoms, which are smaller than silicon atoms, cause a shrinkage of the silicon lattice. Thus the doped layer has a high tensile strain compared to the substrate, causing the wafer to bow. The bow is severe enough that many pieces of fabrication equipment cannot handle the wafers. Therefore, additional layers or processes are required to control the wafer bow and create a relatively flat wafer. Two methods, boron-germanium co-doping and a backside tensile layer, have been widely used for controlling wafer bow. Germanium co-doping and backside tensile layering are described below in detail with respect to FIGS. 2 and 3 respectively.

There are two negative consequences of boron-germanium co-doping that make this approach unusable for some devices. One negative consequence is that the high germanium concentration ($>1\times10^{21}$ cm$^{-3}$) degrades the mechanical properties of the silicon. An example of this is a high level of internal damping in a MEMS resonator. Another negative consequence is that the differing diffusion coefficients of boron and germanium in silicon result in some segregation at the interface between the substrate and the doped layer. This segregation creates undesirable stress gradients at the edge of the doped layer.

With regard to the backside tensile stress layer, when a heavily boron doped layer is deposited on a lightly doped substrate, the resultant wafer is heavily bowed as described above. A backside tensile stress layer balances the stress on the front side of the wafer, yielding a flat wafer. However, such a process requires more expensive, double-side polished substrates, more expensive, double-side deposition, more careful handling, and wafer preparation that must be done after epitaxial growth but before device fabrication can begin.

BRIEF SUMMARY OF THE INVENTION

In one aspect, a method for controlling bow in wafers which utilize doped layers is provided. The method comprises depositing a silicon-germanium layer onto a substrate, depositing an undoped buffer layer onto the silicon-germanium layer, and depositing a boron doped layer onto the undoped layer.

In another aspect, a wafer is provided which comprises a substrate layer, a silicon-germanium layer deposited onto the substrate layer, an undoped buffer layer deposited onto the silicon-germanium layer, and a boron doped silicon layer deposited onto the undoped layer.

In still another aspect, a micro-electromechanical system is provided which comprises a housing and a micro-machine coupled to the housing. At least a portion of the micro-machine comprises boron-doped silicon that has been etched from a wafer which comprises a substrate layer, a silicon-germanium layer deposited onto the substrate layer, an undoped buffer layer deposited onto the silicon-germanium layer, and a silicon-boron layer deposited onto the undoped buffer layer.

In yet another aspect, a gyroscope is provided which comprises at least one proof mass, at least one motor drive comb, and at least one motor pick-off comb. The proof masses, motor drive combs, and motor pick-off combs comprise boron-doped silicon that has been etched from a wafer which comprises a substrate layer, a silicon-germanium layer deposited onto the substrate layer, an undoped buffer layer deposited onto the silicon-germanium layer, and a silicon-boron layer deposited onto the undoped buffer layer.

In another aspect, a method for reducing and controlling bow in wafers which are formed from stacked and doped silicon layers is provided. The method comprises creating stress-relieving dislocations within the stacked silicon layers.

BRIEF DESCRIPTION OF THE DRAWINGS

FIG. 1 illustrates the problem of bowing when a boron doped layer is deposited on a substrate for construction of a wafer.

FIG. 2 illustrates one solution for the bowing problem of FIG. 1.

FIG. 3 illustrates another solution for the bowing problem of FIG. 1.

FIG. 4 illustrates construction of a wafer which controls an amount of bowing.

DETAILED DESCRIPTION OF THE INVENTION

Figure 5:
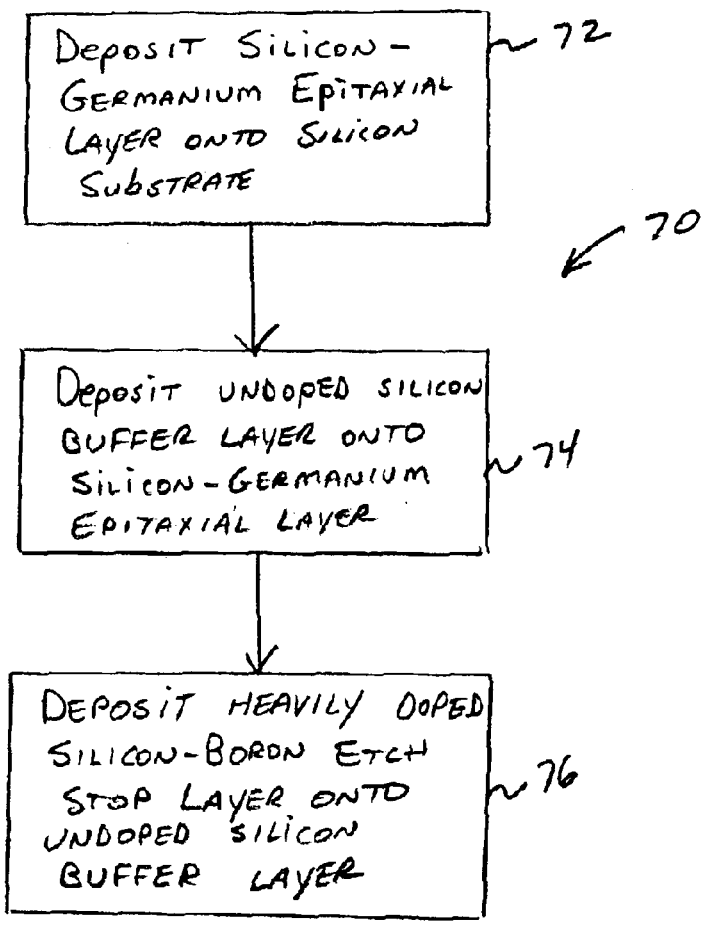
FIG. 5 is a flowchart illustrating a method for producing the wafer illustrated in FIG. 4.

FIG. 1 illustrates the problem of bowing in construction of a wafer 10 when a heavily boron doped silicon layer 12 is deposited on a silicon substrate 14. In the embodiment shown, a heavily boron doped layer 12 is deposited on silicon substrate 14. In one known scenario, boron dopant concentration in doped layer 12 is $>1\times10^{20}$ cm$^{-3}$. At such a concentration, boron atoms, which are smaller than silicon atoms, cause a shrinkage of the silicon lattice within boron doped silicon layer 12. Thus doped layer 12 has a high tensile strain compared to substrate 14, causing wafer to bow. The bow is severe enough that many pieces of fabrication equipment cannot handle wafers 10 for further fabrication processes, for example, fabrication of a MEMS gyroscope.

FIG. 2 illustrates a boron-germanium co-doping solution for the bowing problem of FIG. 1. Boron-germanium co-doping is one of the known methods for controlling wafer bow. Referring to the Figure, a boron-germanium co-doped layer 20 is deposited on substrate 14, resulting in a relatively flat wafer 22. Germanium is an atom that is larger than silicon, but is in the same column of the periodic table as silicon. Therefore, if the silicon is doped with germanium and boron at the same time, the larger germanium atoms compensate for the smaller boron atoms, but do not create any electronic changes. As stated above, negative consequences for reducing wafer bow through boron-germanium co-doping include degradation of the mechanical properties of silicon and segregation at an interface 24 between substrate 14 and co-doped layer 20. This segregation creates undesirable stress gradients in co-doped layer 20.

FIG. 3 illustrates another known solution for the bowing wafer problem described with respect to FIG. 1. Referring to FIG. 3, heavily boron doped silicon layer 12 is deposited on a first side 30 of silicon substrate 14. A backside tensile stress layer 32, which applies a stress similar to that of doped layer 12, is deposited on a second side 34 of silicon substrate 14 to control bowing of wafer 36. Applying layer 32 to second side 34 of substrate 14, with a stress similar to that on first side 34 of substrate 14, will cause wafer 36 to flatten, providing a higher quality doped material for use in manufacturing operation, for example, the MEMS gyroscopes mentioned above. Backside layer 32, in one embodiment, is heavily boron doped silicon, like layer 12. In alternative embodiments, backside layer 32 is a different material. While utilization of backside tensile stress layer 32 is a workable solution for the problem of wafer bowing, control over the process is not as good as control over the germanium co-doping process. Further, deposition of backside layer 32 involves significantly more processing and/or deposition steps than with germanium co-doping. Also, double-side polished substrates, which are more expensive than ordinary single-side polished substrates, are required for deposition of backside layer 32.

FIG. 4 illustrates an improvement in construction of a wafer 50 which also controls an amount of bowing. In construction of wafer 50, a germanium-silicon layer is used to compensate for stress created by a heavily boron-doped layer, but the germanium doping and the boron doping are done in spatially separated layers. Referring specifically to FIG. 4, a silicon-germanium (Si—Ge) epitaxial layer 52 is deposited on silicon substrate 14. Deposition of Si—Ge layer 52 onto silicon substrate 14 causes the resulting wafer to bow in a direction concave to a back surface 54 of silicon substrate 14 (opposite to the bowing illustrated in FIG. 1). However, the bowing is limited. As stress between silicon substrate 14 and Si—Ge layer 52 builds, it causes dislocations to form in Si—Ge layer 52. The dislocations result in relaxation of the stress. The relaxation results in reduced bowing. A thin, undoped buffer layer 56 of silicon is deposited on top of Si—Ge layer 52 to prevent mixing of Si—Ge layer 52 and a silicon-boron (Si—B) layer 58 which is deposited on buffer layer 56. In one embodiment, layer 58 is a very heavily doped silicon-boron etch stop layer. In a specific embodiment, concentration of boron in Si—B layer 58 is between about 0.1 percent and about 1.0 percent. Silicon-boron layer 58 is grown at temperatures between about 1000° C. and about 1200° C., with boron concentration between about $5\times10^{19}$ and about $5\times10^{20}$ cm$^{-3}$, and a thickness between 5 and 50 μm.

When Si—B layer 58 is deposited above buffer layer 56 and Si—Ge layer 52, a stress buildup is created in an opposite direction from the stress created by deposition of Si—Ge layer 52. The stress attempts to make wafer 50 bow concave toward a front surface 60. Again, dislocations are generated in Si—Ge layer 52 that relax the built up stress and reduces bowing of wafer 50. To restate, bow is reduced by relaxing the stresses instead of by balancing the stress, as is done in known methods.

Generation of dislocations can lead to surface roughness of wafer 50. An appropriate range of deposition parameters, for example, temperature, germanium concentration, and thickness for Si—Ge layer 52 and Si—B layer 58, have been determined that simultaneously yield low bowing and smooth surfaces 54, 60 for wafer 50. Silicon-germanium layer 52 is grown at temperatures between about 600° C. and about 1000° C. with germanium concentration between about 2 and about 20 atomic percent. Silicon-germanium layer 52 is grown with a thickness between about 0.1 and about 5.0 μm.

Germanium-doped layer 52 is utilized to compensate the stress created by boron-doped layer 58, but the germanium doping and the boron doping are done in spatially separated layers. The thickness and concentration of silicon-germanium layer 52 can be adjusted to achieve compensation for boron-doped layer 58. Because silicon-germanium layer 52 is now essentially part of the substrate that will eventually be etched, germanium concentration must be low enough that it does not interfere with the etching.

The layer in which the device (e.g. a MEMS gyroscope) is formed, is now only doped with boron, eliminating the material degradation problems inherent in the above described boron-germanium co-doping. Non-doped buffer layer 56 separates the germanium from the boron, so none of the effects of segregation are present. Further, all of the deposition is done on a front side of the silicon substrate, eliminating the need to turn the wafer over for backside processing. Such wafer construction also avoids potential front side damage from the backside processing steps, and allows the use of lower-cost, single-side polished substrates.

FIG. 5 is a flowchart 70 illustrating a method for producing wafers similar to wafer 50 (shown in FIG. 4). A silicon-germanium epitaxial layer 52 is deposited 72 onto a silicon substrate wafer 14. An undoped silicon buffer layer 56 is deposited 74 onto silicon-germanium epitaxial layer 52. A very heavily boron-doped silicon layer 58 is deposited 76 onto undoped silicon buffer layer. As stresses build in boron-doped silicon layer 58, dislocations are generated in silicon-germanium layer 52, causing it to relax with respect to silicon substrate 14 or boron-doped layer 58. The relaxation reduces the wafer bow to low levels. The method illustrated by flowchart 70 contrasts earlier methods of bow control, for example, a backside tensile stress layer (shown in FIG. 3), where additional layers balance the stress on the two sides of the wafer. Whereas, in the wafer and method illustrated in FIGS. 4 and 5 respectively, stresses are relaxed (i.e., reduced) on one side of the wafer, and therefore, a balancing layer (backside layer 32) on the other side of the substrate is not needed.

Figure 6:
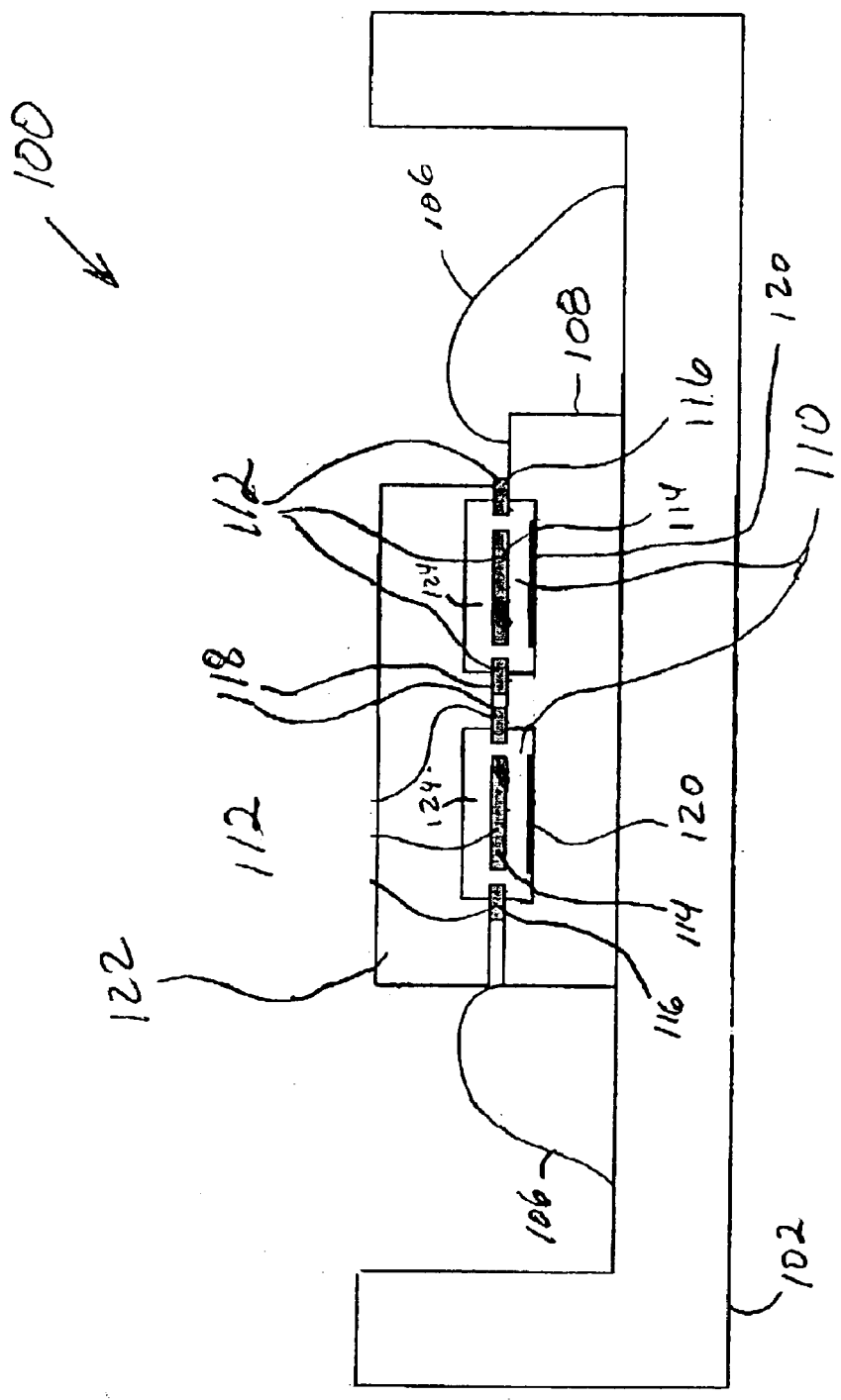
FIG. 6 is a side view of an example MEMS device utilizing the wafer described in FIG. 4.

FIG. 6 is a diagram of one embodiment of a Micro-Electromechanical System (MEMS) 100 constructed utilizing wafer 50 (shown in FIG. 4). While FIG. 6 illustrates a MEMS gyroscope (as described further with respect to FIG. 7), other sensors may also be constructed utilizing wafer 50 as well. For example, an accelerometer, a resonator, a pressure sensor, a temperature sensor, an air flow sensor, and any other device using a heavily boron doped layer which is not necessarily bonded to glass are examples of devices which can be constructed utilizing wafer 50. Therefore, it should be understood that MEMS 100 illustrated in FIG. 6 and described herein are set forth for purposes of example only, and other arrangements and elements can be used instead and some elements may be omitted altogether, depending on manufacturing and/or consumer preferences.

MEMS 100 includes a housing 102 to which a cover (not shown) is eventually attached in order to form a sealed cavity. Electrical leads 106 provide electrical connections to a micro-machine 108 chip which is coupled to housing 102. Micro-machine chip 108 includes a micro-machine 110. At least a portion of micro-machine 110 includes boron-doped silicon 112 that has been etched from boron doped layer 58 (shown in FIG. 4). For example, in the case of a MEMS tuning fork gyroscope, silicon 112 includes, proof masses 114, motor drive combs 116, and motor pick-off combs 118. Micro-machine 110 further includes sense plates 120 which form parallel plate capacitors with proof masses 114. In one embodiment, sense plates 120 are metal films that have been deposited and patterned. A machine cover 122 is coupled to micro-machine chip 108 using multiple bonds, for example, bonds to motor drive combs 116 and motor pick-off combs 118. Such a bonding configuration for machine cover 122, coupled with cavities machined into machine cover 122 provide an open space 124 between machine cover 122 and micro-machine chip 108. Open space 124 allows components of micro-machine 110 an ability to move freely. For example, proof masses 114 may be movably coupled to micro-machine chip 108 and therefore may oscillate within open space 124.

MEMS 100 may comprise more or fewer components than described. For instance, while two electrical contacts 106 are illustrated, those skilled in the art will recognize that a MEMS may comprise more than two contacts and/or extruding pins as well. Additionally, more or fewer members may be present in MEMS 100 other than those components above described. Further, components of MEMS 100 may comprise multiple functions. Machine cover 122 of MEMS 100 may be comprised of a material such as silicon, glass or a ceramic material. Micro-machine 110 may be any such electromechanical machine used in accordance with MEMS and MEMS based devices. In addition, alternate packages may be used as well to provide a housing for MEMS 100.

Figure 7:
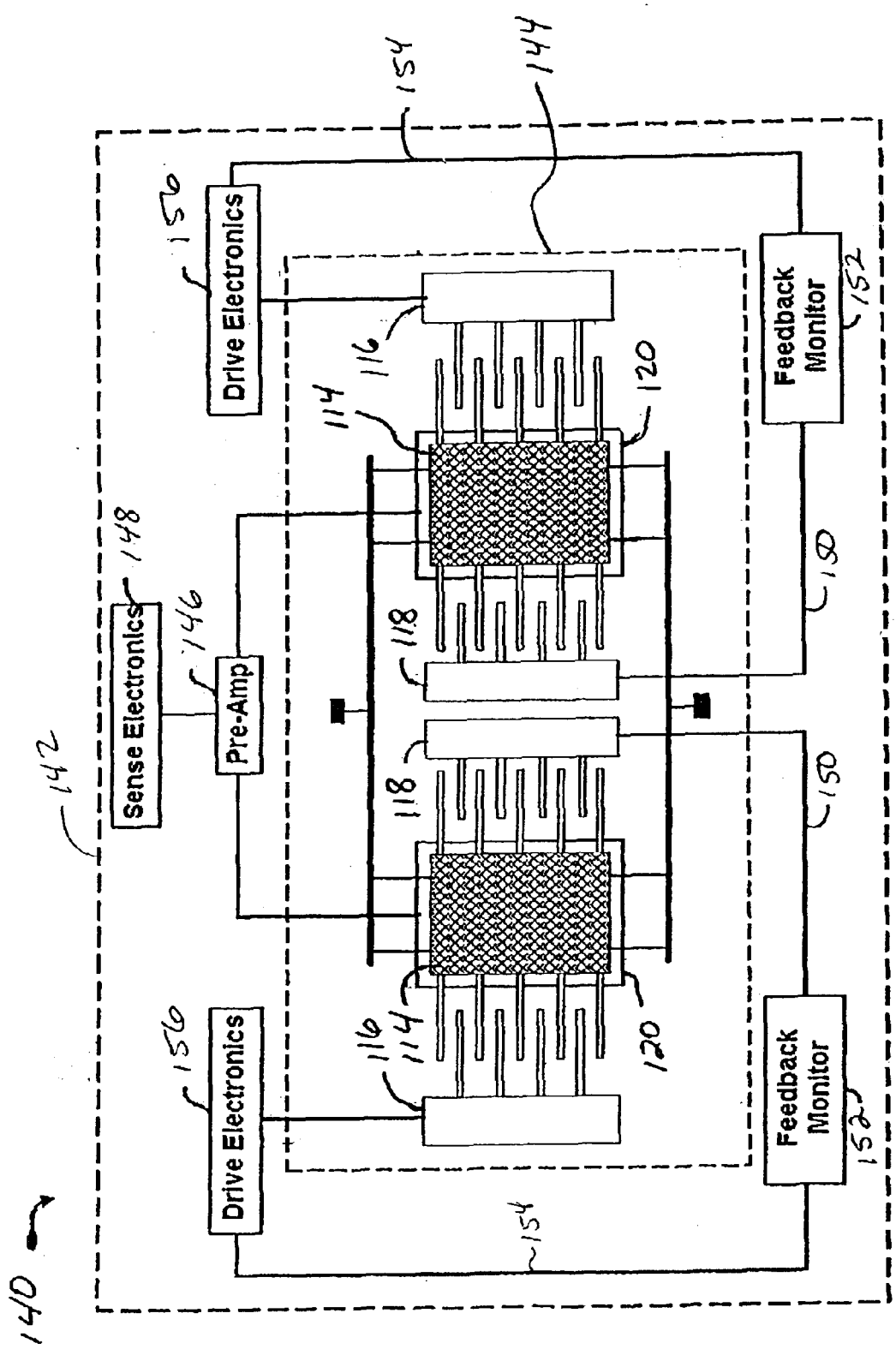
FIG. 7 is a schematic view of a MEMS gyroscope which can be produced utilizing the wafer described in FIG. 4.

FIG. 7 is a schematic illustration of a MEMS gyroscope 140 which illustrates components of such a gyroscope in accordance with the components described in FIG. 6. Gyroscope 140 may utilize a wafer, for example, wafer 50 (shown in FIG. 4) in construction of certain components, as described above. Referring specifically to the Figure, MEMS gyroscope 140 may include a housing 142 that includes therein a tuning fork gyroscope (TFG) 144. Housing 142 may be a plastic package, a small outline integrated circuit (SOIC) package, a plastic leaded chip carrier (PLCC) package, a quad flat package (QFP), or other housings as known in the art. Housing 142 may provide a structure to co-locate elements of TFG 144 and/or locate other elements within a close proximity of one another within the housing 142. TFG 144, in one embodiment, is located within a substantially sealed cavity 105 which is formed by bonding cover 104 (shown in FIG. 6) to housing 102 (shown in FIG. 6).

In one embodiment, TFG 144 may include proof masses 114, motor drive combs 116, motor pick-off combs 118, and sense plates 120 constructed from a wafer, for example, wafer 50 (shown in FIG. 4). A pre-amplifier 146 may be included within housing 142 and may be electrically connected or coupled to each proof mass 114 and sense plate 120 combination. Pre-amplifier 146 and TFG 144 may both be formed on a common substrate and, in one embodiment, may be electrically connected. In other embodiments, pre-amplifier 146 may be electrically connected to proof masses 114. An output of pre-amplifier 146 may be sent to sense electronics 148, or alternatively, pre-amplifier 146 may be incorporated within sense electronics 148.

In addition, an output 150 of motor pick-off combs 118 is transferred to feedback monitors 152. Feedback monitors 152 provide output signals 154 to drive electronics 156, which power motor drive combs 116. Alternatively, feedback monitors 152 may be incorporated within drive electronics 156. MEMS gyroscope 140 may also include a system power source and other operational electronics, which are not shown in FIG. 7 for ease of illustration.

Motor drive combs 116 excite the proof masses 114 using electrostatic forces by applying a voltage to electrodes of proof masses 114. Motor pick-off combs 118 monitor the excitation or oscillation of proof masses 114 by monitoring voltage signals on electrodes on proof masses 114. Motor pick-off combs 118 output a feedback signal to feedback monitors 152. Feedback monitor 152 provides an output 154 which is input to drive electronics 156. If proof masses 114 begin to oscillate too fast or too slow, drive electronics 156 may adjust an oscillation frequency such that proof masses 114 vibrate at a resonant frequency. Excitation at such a frequency may enable a higher amplitude output signal to be generated.

While operation of gyroscope 140 is described in entirety, such operation is not likely if boron-doped wafers, for example, wafer 10 as shown in FIG. 1, bow during a fabrication stage. As described, such bowing may be severe enough to require extra machining steps, which increase production time and add costs. Utilization of a wafer fabrication technique such as embodied in wafer 50 (shown in FIG. 4) provides sensors, that have little or no bowing, and therefore allows fabrication of gyroscope 140. Such wafers are further usable in other sensor based-devices which are mentioned above.

As stated above with respect to FIG. 2, negative consequences of using a germanium-boron co-doped layer to reduce bow include degradation of the mechanical properties of silicon and segregation at the interface between the substrate and the co-doped layer. Therefore, current bow reduction approaches utilize epitaxial deposition on both sides of a silicon substrate, as described above with respect to FIG. 3. The method for wafer bow reduction described with respect to FIGS. 4 and 5 require deposition of layers on only one side of a silicon substrate, which reduces costs associated with of deposition by approximately half over the costs of a backside tensile layer. The illustrated method therefore allows utilization of less expensive, silicon substrates, as only a single side of the substrate has to be polished.

In addition, in the backside tensile layer approach, since epitaxial layers are grown (deposited) on both sides of the silicon substrate, a protective layer has to be deposited over the silicon-boron layer. This protective layer must be stripped off the silicon-boron layer prior to product fabrication (i.e. MEMS gyroscopes), costing more time and money in wafer preparation. Finally, thickness of the epitaxial layers are more easily controlled utilizing the wafer and methods illustrated in FIGS. 4 and 5 respectively, as there is less total time spent at high temperature, thus sharpening the interface between the epitaxial layer and the undoped buffer layer by reducing diffusion. Therefore the advantages described herein include, lower wafer cost due to single sided epitaxial layer deposition, elimination of post-growth wafer preparation, and an improved ability to measure and control thickness. It is contemplated that the wafer construction method and resultant wafers described herein will find utilization in a variety of MEMS products, including, but not limited to, MEMS inertial guidance products, gyroscopes, and accelerometers.

While the invention has been described in terms of various specific embodiments, those skilled in the art will recognize that the invention can be practiced with modification within the spirit and scope of the claims.

What is claimed is:

1. A method for controlling bow in wafers which utilize doped layers, said method comprising:

depositing a silicon-germanium layer onto a substrate;

depositing an undoped buffer layer onto the silicon-germanium layer; and depositing a boron doped layer onto the undoped layer.

2. A method according to claim 1 further comprising applying the silicon-germanium layer at a temperature of about 600 degrees C to about 1000 degrees C.

3. A method according to claim 1 wherein depositing a silicon-germanium layer comprises depositing a silicon-germanium layer with a thickness between about 0.1 to about 5.0 micrometers.

4. A method according to claim 1 wherein depositing an undoped buffer layer comprises depositing an undoped buffer layer with a thickness between about 0.1 to about 5.0 micrometers.

5. A method according to claim 1 wherein depositing a boron doped layer comprises depositing a silicon-boron layer with a thickness between about 5.0 and about 50.0 micrometers.

6. A method according to claim 1 wherein a concentration of germanium in the silicon-germanium layer is between about 2.0 percent and about 50.0 percent.

7. A method according to claim 1 wherein a concentration of boron in the boron doped layer is between about $5 \times 10^{19}$ and about $5 \times 10^{20}$ cm$^{-3}$.

8. A method for reducing and controlling bow in wafers which are formed from stacked and doped silicon layers comprising creating stress-relieving dislocations within the stacked silicon layers.

9. A method according to claim 8 wherein creating stress-relieving dislocations within the stacked layers comprises spatially separating doped layers with a silicon-germanium alloy.

10. A method according to claim 8 wherein creating stressing relieving dislocations within the stacked layers comprises spatially separating a silicon-germanium layer and a silicon-boron layer with an undoped silicon layer.

* * * * *

UNITED STATES PATENT AND TRADEMARK OFFICE
CERTIFICATE OF CORRECTION

PATENT NO. : 6,770,504 B2
DATED : August 3, 2004
INVENTOR(S) : Horning et al.

It is certified that error appears in the above-identified patent and that said Letters Patent is hereby corrected as shown below:

Column 1,
Lines 7-8, delete "Contract No. F33615-01-02-5705" and insert therefor -- Contract No. F33615-01-3-5705 --.

Column 2,
Line 66, delete "wafer to" and insert therefor -- wafer 10 to --.

Column 5,
Line 12, delete "machine 108 chip" and insert therefor -- machine chip 108 --.
Line 61, delete "scaled cavity" and insert therefor -- sealed cavity --.

Column 8,
Line 25, delete "stressing relieving" and insert therefor -- stress-relieving --.

Signed and Sealed this

Eighteenth Day of January, 2005

JON W. DUDAS
*Director of the United States Patent and Trademark Office*